United States Patent [19]

Hoffmann et al.

[11] Patent Number: 4,547,454
[45] Date of Patent: Oct. 15, 1985

[54] PHOTOSENSITIVE MULTI-LAYER MATERIAL AND PREPARATION OF ADHESIVE LAYERS EMPLOYED THEREIN

[75] Inventors: Gerhard Hoffmann, Otterstadt; Bernd Bronstert, Frankenthal; Herbert Hahn, Ludwigshafen; Mong-Jon Jun, Speyer, all of Fed. Rep. of Germany

[73] Assignee: BASF Aktiengesellschaft, Fed. Rep. of Germany

[21] Appl. No.: 650,713

[22] Filed: Nov. 14, 1984

Related U.S. Application Data

[63] Continuation of Ser. No. 324,279, Nov. 23, 1981, abandoned.

[30] Foreign Application Priority Data

Dec. 3, 1980 [DE] Fed. Rep. of Germany ....... 3045515

[51] Int. Cl.$^4$ ............................................. G03C 1/78
[52] U.S. Cl. .................................. 430/271; 430/275; 430/276
[58] Field of Search ................ 430/271, 276, 275, 281

[56] References Cited

U.S. PATENT DOCUMENTS

| | | | |
|---|---|---|---|
| 3,258,339 | 6/1966 | Adams et al. | 430/276 |
| 3,307,951 | 3/1967 | Adams et al. | 430/276 |
| 3,861,921 | 1/1975 | Hoffmann et al. | 430/276 |
| 4,355,093 | 10/1982 | Hartmann et al. | 430/275 |
| 4,357,414 | 11/1982 | Hartmann et al. | 430/271 |

Primary Examiner—Jack P. Brammer
Attorney, Agent, or Firm—Keil & Weinkauf

[57] ABSTRACT

A photosensitive multi-layer material comprising a base, which may or may not be provided with an adhesion-promoting layer, and a photopolymerizable layer, consisting of a mixture of a photoinitiator, a binder and a photopolymerizable monomer, possesses, between the base and the photopolymerizable layer, an adhesive layer of a hardened mixture of a binder and an etherified melamine-formaldehyde condensate, hardenable at 60°–120° C.

2 Claims, No Drawings

PHOTOSENSITIVE MULTI-LAYER MATERIAL AND PREPARATION OF ADHESIVE LAYERS EMPLOYED THEREIN

This is a continuation of application Ser. No. 324,279, filed Nov. 23, 1981, now abandoned.

The present invention relates to a photosensitive multi-layer material, suitable for the manufacture of a photopolymer printing plate, which possesses a special adhesive layer between the base and a photosensitive layer containing a binder and a photopolymerizable ethylenically unsaturated compound, and to a process for the preparation of such an adhesive layer.

It is known, for example from U.S. Pat. No. 3,861,921, that photosensitive relief-forming layers for printing plates can be firmly anchored to the base by special adhesive layers. In this process, the base, for example a steel or aluminum sheet, is first coated with an adhesion-promoting layer (APL) to improve adhesion between the base and the relief-forming photosensitive layer, and an adhesive layer (AL) is then produced by applying, and drying and baking, a layer of a hardenable mixture containing a binder which is compatible with the polymeric binder of the relief-forming layer. However, baking the adhesive layer AL requires the use of high temperatures, which not only entails a high energy consumption and correspondingly high manufacturing costs, but also rules out the use of certain base materials because their properties seriously deteriorate on heat treatment. This is true, for example, of the production of photopolymer printing plates having a polyester film base. It is true that lowering the hardening temperature of hardenable formaldehyde resins by adding an acid as a catalyst has been disclosed, but because such catalyzed resins have a short pot life they are unsuitable for the production of uniform coatings and of homogeneous thin adhesive layers.

It is an object of the present invention to provide an improved process for the preparation of adhesive layers for photosensitive multi-layer materials, which permits the preparation of durable and solvent-resistant adhesive layers even below 100° C. and which is also applicable to the preparation of multi-layer materials having a plastic film base.

We have found that this object is achieved if the hardenable mixture for the preparation of the adhesive layer AL adjacent to the relief-forming photosensitive layer R consists essentially of (A1) 65–98% by weight of a binder which is compatible with the binder of layer R and with the condensate (A2) and (A2) 2–35% by weight of a melamine-formaldehyde condensate, hardenable at 60°–120° C., which contains 1–5 melamine units per molecule and has a degree of methylolation of the melamine of 40–100%, 10–60% of the methylol groups being etherified with an alcohol, and if the mixture, after application, is hardened by heating.

The present invention relates not only to the process for preparing such adhesive layers, but also to a photosensitive multi-layer material which has, between (a) a base B which may or may not be provided with an adhesion-promoting layer APL and
(b) a photosensitive layer R consisting of a photoinitiator-containing mixture of one or more binders and one or more photopolymerizable ethylenically unsaturated compounds compatible therewith,
(c) an adhesive layer AL, adjacent to the photosensitive layer R, consisting essentially of a hardened mixture of
(A1) 65–98, in particular 80–90, % by weight of a binder which is compatible with the binder of the layer R and with the condensate (A2) and
(A2) 2–35, especially 10–20, % by weight of a melamine-formaldehyde condensate which is hardenable at 60°–120° C., preferably at 70°–90° C., contains 1–5 melamine units per molecule and has a degree of methylolation of the melamine of 40–100%, 10–60% of the methylol groups being etherified with an alcohol.

An essential feature of the invention is the use of the condensate (A2) in the adhesive layer AL; this permits hardening, without acid catalysis, in the stated low temperature range. The hardenable formaldehyde condensate, which is oligomeric or, preferably, monomeric, is prepared from melamine and formaldehyde under conditions such that the degree of methylolation of the melamine is 40–100%, preferably 60–80%, and that 10–60%, preferably 20–50%, of the methylol groups are etherified with an alcohol, especially an alcohol of 1 to 4 C atoms. The mean molecular weights of particularly suitable condensates are from about 240 to 1,800.

Condensates which have proved particularly suitable are the mono- and di-$C_1$-$C_4$-alkyl ethers of tetramethylolmelamine, especially the corresponding methyl ethers, and partial ethers, of corresponding structure, of methylolated melamine-formaldehyde condensates with up to 5 melamine units in the molecule.

Binders (A1) used for the mixtures hardenable are, on the one hand, compatible with the above condensates, whilst on the other hand, in order to achieve good adhesion to the relief-forming photosensitive layer R, they are also compatible with the binder or binders used in the said layer. In most cases it has proved advantageous to employ the same polymeric binder, or at least a polymeric binder of very similar structure, for the adhesive layer AL and for the photosensitive layer R.

Suitable polymeric binders for the photosensitive layer R are virtually any of the polymeric binders disclosed, in the literature, for the preparation of photopolymer printing plates or relief plates. Examples include nylons and especially alcohol-soluble nylon copolymers, as described in French Pat. No. 1,520,856, cellulose derivatives, especially those which can be washed out with aqueous alkali, vinyl alcohol polymers, polymers and copolymers of vinyl esters of aliphatic monocarboxylic acids of 1–4 carbon atoms, such as of vinyl acetate, which may be hydrolyzed to varying degrees, homopolymers and copolymers of vinylpyrrolidone, of vinyl chloride and of styrene, polyurethanes, polyether-urethanes, polyester-urethanes, polyester resins, copolymers of acrylic acid esters and methacrylic acid esters, such as copolymers of methyl methacrylate with acrylic acid, methacrylic acid, acrylamide and/or hydroxyalkyl acrylates or methacrylates, and elastomeric diene polymers and copolymers, such as block copolymers comprising butadiene and/or isoprene homopolymer blocks and styrene or α-methylstyrene polymer blocks. They are present in the layer R, as is usual, as a mixture with one or more photopolymerizable, ethylenically unsaturated, low molecular weight compounds compatible therewith, preferably ethylenically polyunsaturated compounds, the nature and amount of which depend on the nature of the polymeric binder and the intended use of the photosensitive multi-layer material.

The ratio of monomer to polymeric binder in the mixture can be varied within a wide range; preferably, the mixture contains 10–55, especially 25–50, % by weight of monomers and 45–90, especially 50–75, % by weight of polymeric binders, based on the sum of monomers and polymeric binders. Preferably, the layer R is solid at room temperature and is 200–1,200 μm thick. The content of conventional photoinitiators, which can form free radicals when exposed to actinic light, is in general 0.01–15% by weight of the total amount of the layer R.

Examples of suitable bases B are steel sheet, aluminum sheet and plastic film or sheet, consisting, for example, of a polyester, eg. polyethylene terephthalate, polycarbonate, polyvinyl chloride or nylon.

In most cases it has proved very advantageous to provide the base B with an adhesion-promoting layer APL before applying the adhesive layer AL. A variety of adhesion-promoting layers APL can be employed, provided these ensure adequate adhesion between the base B and the adhesive layer AL and can, if necessary, be dried and baked at temperatures which do not adversely affect the properties of the base B.

In most cases, adhesion-promoting layers which have proved very suitable are pigmented and unpigmented layers produced from reactive adhesive-forming compounds, such a polyisocyanates and hydroxyl-containing oligomers and polymers, eg. hydroxyl-containing epoxy resins and/or hydroxyl-containing polyesters (preferably with molecular weights of from 20,000 to 30,000) or mixtures of these with other polyols, for example butane-1,4-diol. For example, to prepare the adhesion-promoting layer APL, a solution of the said compounds, having a solids content of 20–70% by weight, is applied to the base B in an amount which gives a dry layer of thickness 3–100 μm, preferably 5–20 μm. Coating can be effected by means of one of the conventional techniques, such as brushing, spraying, dipping, casting or roller-coating. Thereafter, the coating can be dried and baked at from 50° to 300° C., depending on the particular base.

To prepare the adhesive layer AL, the non-hardened mixture employed according to the invention is applied, as a solution, to the base (which has preferably been provided with the adhesion-promoting layer), the amount applied being such as to give, advantageously, a dry coating thickness of 3–25 μm, especially 5–15 μm. Coating can likewise be effected by brushing, spraying, dipping, casting or roller-coating. Advantageously, the layer is dried before it is baked, preferably without a hardening catalyst, at 60°–120° C., preferably 70°–90° C.

Thereafter the layer R is advantageously laminated to the base provided with the adhesive layer AL, the solvent used as laminating aid depending on the binder in the layer R.

The novel multi-layer material is particularly suitable for the production of relief plates or relief printing plates. For example, sheets of the material can be processed into printing plates in a conventional manner, by exposing them imagewise (after optional overall exposure thereof which does not cause crosslinking of the photosensitive layer R) through a suitable negative, developing the relief by washing out the unexposed areas with water or with a suitable solvent mixture, drying them and, if necessary, post-exposing them over their entire surface. The conventional light sources which emit actinic rays, such as carbon arc lamps, mercury vapor lamps, xenon lamps or fluorescent tubes, can be used for preexposure, imagewise exposure and postexposure. The relief can be developed by spraying the exposed multi-layer material with a solvent, using a suitable nozzle system, or by rubbing the exposed material, in a solvent, with velvet or suitable brushes (mounted on rotating and/or oscillating discs, rollers or belts). The most advantageous method of drying the plates is by a hot air blower and/or by exposure to infrared radiation.

In the following examples which illustrate the invention, and the Comparative Experiments, parts and percentages are by weight, unless stated otherwise.

EXAMPLE 1

1.1. Preparation of the adhesion-promoting layer APL 243 parts of a commercial epoxy resin (prepared from bisphenol A and epichlorohydrin), having an epoxide equivalent of about 0.02 (based on 100 g of resin), a molecular weight of about 5,500 and an OH content of 5.9%, and 147 parts of finely divided lithopone (ZnS content 60%), 3 parts of finely divided rutile, 6 parts of finely divided chrome oxide green, 90 parts of talc and 20 parts of a commercial paste of a bentonite modified with organic ammonium bases are milled with butyl acetate, ethylglycol acetate and xylene in a ball mill for 2 days.

The resulting composition is mixed with 346 parts of a commercial reaction product (serving as the polyisocyanate) of 1 mole of 1,1,1-trimethylolpropane and 3 moles of toluylene diisocyanate, in the form of a 75% strength solution in a 1:1 xylene/ethylglycol acetate mixture, and 4 parts of a 1% strength solution of dibutyltin dilaurate in tetrahydrofuran. A 70 μm layer of the resulting mixture is applied by casting to a biaxially oriented polyethylene terephthalate film. The coating is allowed to stand in the air for 1 hour at room temperature and is then baked for 5 minutes in a through-circulation cabinet dryer at 100° C.

The resulting dry adhesion-promoting layer APL is about 12 μm thick.

1.2 Preparation of the adhesive layer AL 341 parts of a nylon copolymer of about equal parts of hexamethylenediammonium adipate, 4,4'-diammonium dicyclohexylmethane adipate and ε-caprolactam, having a K value (as defined by Fikentscher, Cellulosechemie 13 (1932), 58) of 67, and 65 parts of a commercial, hardenable methanol-etherified melamine-formaldehyde condensate having a mean molecular weight of about 280 (the condensate having been prepared by reacting melamine with excess formaldehyde in the presence of methanol in a slightly acidic medium, and having a degree of methylolation of the melamine of 100%, and a degree of etherification of the methylol groups of about 50%) are dissolved in alcohol at room temperature. A layer of the solution is applied, by means of a knife coater, to the base, carrying the adhesion-promoting layer APL, so as to give a dry coating thickness of 7 μm. After standing in the air for about 30 minutes at room temperature, the layer is hardened for 5 minutes in a through-circulation cabinet dryer at 90°–108° C.

1.3 Application of the photosensitive layer R 0.3% of the potassium salt of N-nitrosocyclohexylhydroxyamine and 0.01% of a black dye (Color Index No. 12,195) are added to a 65% strength solution of a mixture of 60% of the nylon copolymer described under 1.2, 25% of the diether of 1 mole of ethylene glycol and 2 moles of N-hydroxymethyl-acrylamide, 13.5% of benzenesulfonamide and 1.5% of benzoin tetrahydropyranyl ether. A layer of the solution is cast onto the polyester film provided with the layers as described in 1.1 and 1.2, in an amount such that after drying at about 70° C. a photosensitive layer R which is about 600 μm thick results.

1.4 Testing the multi-layer material

The multi-layer material is exposed imagewise through a negative and the minimum exposure time required to produce a firmly supported isolated dot of 200 μm diameter is determined. It is found to be 3.5 min.

A strip of material 2 cm wide is cut out of a solid area before and after washout. The adhesion between the exposed relief-forming layer (R) and the polyester film base (B) is determined on each strip. The force required to detach the exposed layer from the base is found to be about 3,500–4,000 pond both before and after the washing-out step.

COMPARATIVE EXPERIMENT 1

The procedure followed is exactly as in Example 1, but in order to prepare the adhesive layer AL as described in 1.2, the melamine-formaldehyde resin is replaced by an equal amount of a hardenable phenolic resin (prepared by condensing 30 parts of phenol and 7.5 parts of bisphenol A with excess formaldehyde at 100° C. in the presence of dimethylethanolamine).

The minimum exposure time as defined in 1.4 is 4.5 min. The force required to effect delamination, before washout, is about 2,600 pond, whilst after washout all the fine relief image sections are found to have disappeared and large solid areas can be detached with a force of about 20–50 pond. The adhesive layer (AL) is no longer present after washout, indicating that it had not been hardened.

EXAMPLE 2

The procedure followed is exactly as in Example 1, except that the adhesion-promoting layer APL is unpigmented, ie. the material applied consists only of 243 parts of the epoxy resin, 346 parts of the polyisocyanate and 4 parts of a 1% strength solution of dibutyl-tin dilaurate.

This composition gives the same adhesion as that achieved in Example 1.

EXAMPLE 3

3.1 Preparation of the adhesion-promoting layer APL 100 parts of a polyurethane prepared from a linear saturated polyester having a mean molecular weight of 1,600 and a hydroxyl content of about 1.3% and 4,4'-cyclohexylphenylmethane diisocyanate, and 50 parts of the polyisocyanate employed in Example 1, are processed into a 10% strength solution in a solvent mixture of 7 parts of tetrahydrofuran and 3 parts of methyl ethyl ketone. 1.4 parts of a 1% strength solution of dibutyl-tin dilaurate in tetrahydrofuran are added and the mixture is then applied to a sand-blasted 90 μm thick polyester film. The coated film is allowed to stand in the air for 20 minutes and then heated for 10 minutes at 90° C. The resulting adhesion-promoting layer APL is 8 μm thick.

3.2 Preparation of the adhesive layer AL

An adhesive layer AL of 175 parts of an elastomeric styrene-isoprene-styrene three-block copolymer and 68 parts of the melamine-formaldehyde condensate used in Example 1, dissolved in toluene, is applied to the film carrying the adhesion-promoting layer APL. After standing in the air for 30 minutes at room temperature, the layer is hardened for 5 min at 100° C. The hardened adhesive layer AL is 15 μm thick.

3.3 Application of the photosensitive layer R

A layer of 80 parts of a binder consisting of the block copolymer mentioned in 3.2, 15 parts of butane-1,4-diol dimethacrylate, 1.7 parts of benzoin methyl ether and 0.3 part of hydroquinone monomethyl ether is laminated onto the adhesive layer AL and the resulting multi-layer material is stored for 3 days at room temperature.

3.4 Testing the multi-layer materials

The test is carried out as described in 1.4. The force required to effect delamination is as follows:
Before washing-out: 1,400 pond
After washing-out: 900–1,000 pond.
The bond is durable.

COMPARATIVE EXPERIMENT 2

The procedure followed is exactly as in Example 3, except that in place of the melamine-formaldehyde condensate the phenol-formaldehyde condensate mentioned in Comparative Examperiment 1 is employed. The force required to effect delamination is found to be about 1,200 pond before washing-out and 20–40 pond after washing-out, fine relief image sections being completely removed by the washing-out process.

EXAMPLE 4

The procedure followed is exactly as in Example 1, except that rutile is used in place of lithopone and the base used is a 240 μm thick steel sheet in place of the polyester film.

The adhesion-promoting layer APL and the adhesive layer AL are each baked for 4 minutes at 140° C. in a through-circulation cabinet dryer.

The force required to effect delamination is greater than 6,000 pond both before and after washing-out.

COMPARATIVE EXPERIMENT 3

The procedure followed is exactly as in Example 4, except that in place of the melamine-formaldehyde condensate the phenol-formaldehyde condensate mentioned in Comparative Experiment 1 is employed. To achieve the same bond as in Example 4, the adhesive layer AL must be baked for 6 min at 240° C. Accordingly, the curable mixtures according to the invention provide a substantial energy saving.

EXAMPLE 5

The procedure described in Example 1 is followed, except that the adhesion-promoting layer APL is prepared from 97 parts of a saturated polyester having a mean molecular weight of about 25,000 and an OH number of 2–3 and 2.25 parts of 1,3,5-tris-(6-isocyanatohexyl)-biuret. The force required to effect delamination is about 3,000 pond before washing-out and 2,800–3,100 pond after washing-out.

We claim:

1. A photosensitive multi-layer material which has, between (a) a base B and (b) a photosensitive layer R consisting of a mixture containing at least one polymeric binder, at least one photo-polymerizable ethylenically unsaturated low molecular weight compound compatible therewith and at least one photoinitiator, (c) an adhesive layer AL, adjacent to the photosensitive layer R, which has been cured by heating to a temperature of from 60° to 120° C. and is based on an intimate mixture consisting essentially of (A1) 65–98% by weight of a polymeric binder which is compatible with the polymeric binder of the layer R and with the condensate (A2), and (A2) 2–35% by weight of a melamine-formaldehyde condensate, hardenable at 60°–120° C., which contains 1–5 melamine units per molecule and has a degree of methlolation of the melamine of 40–100%, 10–60% of the methylol groups being etherified with an alcohol.

2. A photosensitive multi-layer material as set forth in claim 1, wherein the base B is provided with an adhesion-promoting layer APL on the side facing the adhesive layer AL, which layer APL is produced from polyisocyanates and hydroxyal-containing oligomers or polymers.

* * * * *